United States Patent [19]

Nakayama

[11] Patent Number: 4,500,849
[45] Date of Patent: Feb. 19, 1985

[54] LOW NOISE POWER AMPLIFIER CIRCUIT
[75] Inventor: Kazuaki Nakayama, Tokyo, Japan
[73] Assignee: Pioneoer Electronic Corporation, Tokyo, Japan
[21] Appl. No.: 463,764
[22] Filed: Feb. 4, 1983
[30] Foreign Application Priority Data Feb. 5, 1982 [JP] Japan ................................ 57-17930

[51] Int. Cl.³ .......................... H03F 3/16; H03F 3/26
[52] U.S. Cl. ................................. 330/300; 330/264; 330/269; 330/311; 330/156
[58] Field of Search ............... 330/264, 269, 273, 277, 330/300, 310, 311, 156

[56] References Cited
U.S. PATENT DOCUMENTS 4,390,852  6/1983  Addis .................................. 330/300

Primary Examiner—James B. Mullins
Assistant Examiner—Steven J. Mottola
Attorney, Agent, or Firm—Sughrue, Mion, Zinn, Macpeak and Seas

[57] ABSTRACT

A low noise power amplifier in which a buffer including a field effect transistor coupled in a source follower configuration is interposed between a voltage amplifying stage and a power amplifying stage, the latter utilizing a single-ended push-pull emitter follower configuration. A cascode transistor is cascade connected with the field effect transistor. A constant current source is provided for supplying current to the source of the field effect transistor. Field effect transistor buffers are preferably provided between the voltage amplifying stage and both positive and negative amplifying portions of the power amplifying stage.

3 Claims, 3 Drawing Figures

LOW NOISE POWER AMPLIFIER CIRCUIT

BACKGROUND OF THE INVENTION

The present invention relates to an amplifier circuit. More particularly, the invention relates to an amplifier circuit having an output power amplifying stage having transistors connected in an SEPP (Single-Ended Push-Pull) emitter follower configuration.

An amplifier circuit having a power amplifying stage of the Class B SEPP type employing an emitter follower configuration and utilizing bipolar transistors has been known. This circuit suffers from a problem of distortion in the output signal due to the output stage of the circuit operating as an emitter follower circuit. The reasons for this will be described in detail with reference to FIG. 1.

Assuming that the base current of the emitter follower transistor $Q_1$ is represented by $i_b$, the base-emitter voltage of the transistor $Q_1$ is represented by $V_{BE}$, and the current amplification factor thereof is represented by $h_{fe}$, the following equation may be written:

$$e_o + V_{BE} + R_g \cdot i_b = e_i, \quad (1)$$

where, $e_o$ and $e_i$ represent output and input voltages of the circuit, respectively, and $R_g$ represents its input resistance. Since $i_b$ may be expressed as:

$$i_b = e_o/(1 + h_{fe}) \cdot R_L, \quad (2)$$

equation (1) can be rewritten in the form:

$$e_o = (e_i - V_{BE})/\left(1 + \frac{R_g}{R_L(1 + h_{fe})}\right). \quad (3)$$

From this equation, it is apparent that the factors which can contribute to distortion of the output $e_o$ are nonlinearities in the terms $V_{BE}$ and $h_{fe}$. In equation (3), $V_{BE}$ cannot be zero, but the righthand term of the denominator can theoretically be reduced to zero by making the input resistance $R_g = 0$. However, it is of course impossible to realize $R_g = 0$, and in an ordinary SEPP circuit, a relation of:

$$1 << \frac{R_g}{R_L(1 + h_{fe})}$$

holds. Any attempt to realize $R_g << R_L(1 + h_{fe})$ by, for instance, increasing the number of stages in a Darlington circuit has the restriction that the output load impedance $R_L$ of the circuit will be made very low. As a consequence, the output of the SEPP circuit of the emitter follower type is most strongly distorted by nonlinearities in the term $h_{fe}$. Hence, elimination of such distortion has been strongly desired.

The input impedance $Z_i$ of an emitter follower circuit can be expressed as:

$$Z_i = h_{ie} + R_L(1 + h_{fe}), \quad (4)$$

where, $h_{ie}$ represents the input resistance of the transistor $Q_1$ with the emitter grounded. The principal factors which can cause distortion of $Z_i$ are $h_{ie}$ and $h_{fe}$. Although $h_{ie}$ varies with current, the impedance $Z_i$ is principally defined by $R_L$ and $h_{fe}$ since $h_{ie} << R_L(1 + h_{fe})$. Among these, $h_{fe}$ is nonlinear as described above, and in a case where an actual load such as a loudspeaker is utilized as $R_L$, the input impedance $Z_i$ inevitably exhibits not only a significant nonlinearity, but also a wide phase variation. Since the input impedance $Z_i$ acts as a load on the preceding stage of the overall circuit, variations of the input impedance $Z_i$ cause severe distortion in the preceding circuit. Furthermore, if negative feedback is used in the circuit, the transient characteristics of the circuit are degraded.

Accordingly, an object of the present invention is to provide an amplifier circuit in which distortion present in an ordinary SEPP circuit of the emitter follower type is minimized, and undesirable effects of the load $R_L$ on the input impedance $Z_i$ of the SEPP circuit are eliminated, thereby improving the transient response characteristics of the circuit.

SUMMARY OF THE INVENTION

In accordance with these and other objects of the invention, there is provided an amplifier circuit including a buffer amplifier composed of one or more field effect transistors connected in a source follower configuration provided between a voltage amplifier stage and an emitter follower type SEPP power amplifier stage. The buffer preferably includes a cascode transistor which is cascode connected with the field effect transistor. The buffer may further include a constant current source which supplies current to the source of the field effect transistor.

DESCRIPTION OF THE PREFERRED EMBODIMENTS

The invention will now be described in detail with reference to the accompanying drawings.

Figure 2:
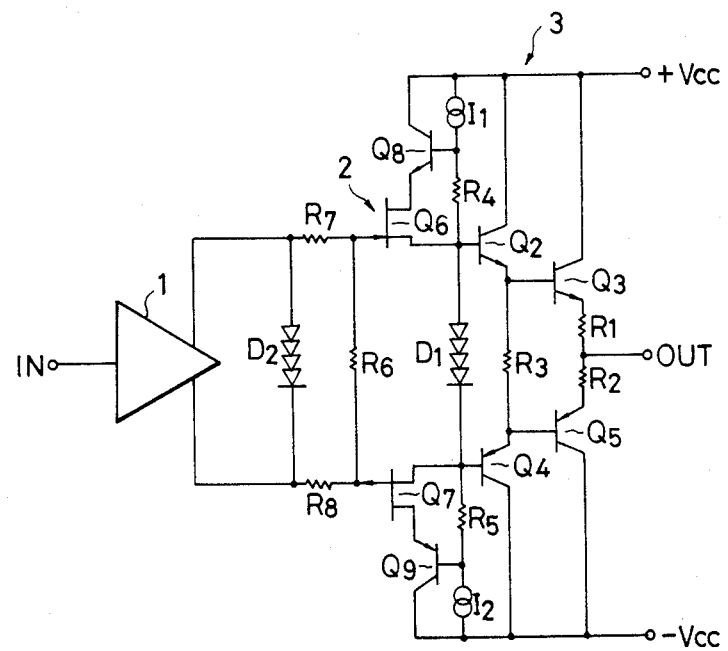
FIGS. 2 and 3 are circuit diagrams of preferred embodiments of amplifier circuits of the present invention.

FIG. 2 is a schematic diagram of a preferred embodiment of an amplifier circuit of the present invention. In this diagram, reference numeral 1 designates a voltage amplifying stage which operates in a Class A mode, and reference numeral 3 designates a power amplifying stage of the Class B type composed of complementary bipolar transistors $Q_2$ through $Q_5$ connected in an SEPP configuration. More specifically, NPN transistors $Q_2$ and $Q_3$ and PNP transistors $Q_4$ and $Q_5$ are connected in Darlington pairs, with the emitter follower outputs of the transistors $Q_3$ and $Q_5$ driving a load such as a loudspeaker (not shown) in a push-pull manner through resistors $R_1$ and $R_2$. A resistor $R_3$ is further provided between the emitters of the transistors $Q_2$ and $Q_4$, and a biasing diode $D_1$ is connected between the bases of the transistors $Q_2$ and $Q_4$.

Reference numeral 2 designates a source follower buffer circuit implemented with FETs (Field Effect Transistors). In this circuit, the source output of an N-channel FET $Q_6$ is connected to drive the base of the transistor $Q_2$, and the source output of a P-channel FET $Q_7$ is connected to drive the base of the transistor $Q_4$. The output of the voltage amplifying stage 1 is applied across the gates of the FETs $Q_6$ and $Q_7$ through resistors $R_7$ and $R_8$. A resistor $R_6$ is connected between the gates of $Q_6$ and $Q_7$, and a bias diode $D_2$ is connected between the input terminals of the resistors $R_7$ and $R_8$ for supplying bias voltages to the transistors $Q_2$ through $Q_5$ and the FETs $Q_6$ and $Q_7$.

An NPN transistor $Q_8$ and a PNP transistor $Q_9$ are connected between the drain of the transistor $Q_6$ and the positive terminal of the power supply and between the drain of the transistor $Q_7$ and the negative terminal of the power supply, respectively, in a cascade manner. Constant current sources $I_1$ and $I_2$ are provided to cause constant currents to flow through resistors $R_4$ and $R_5$ and also the diode $D_1$. The voltages thereby developed across the resistors $R_4$ and $R_5$ are applied to the bases of the cascade transistors $Q_8$ and $Q_9$, respectively.

Figure 1:
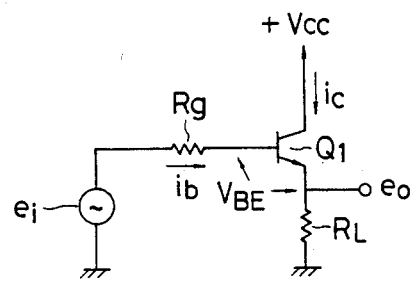
FIG. 1 is a circuit diagram used in explaining the reasons for distortion in a prior art emitter follower circuit.

With the above-described construction of the amplifier circuit, the source follower operation of the FETs $Q_6$ and $Q_7$ permits direct application of the output voltage from the voltage amplifying stage 1 to the bases of the transistors $Q_2$ and $Q_4$ of the power amplifying stage 3, thus providing an SEPP operation similar to that of the conventional circuit. However, since the FETs theoretically have a current amplifying factor of zero, the distortion component related to the $h_{fe}$ term, which caused the greatest part of the total distortion in the prior art circuit discussed above with reference to FIG. 1, is substantially completely eliminated. Furthermore, since the input impedance of the buffer circuit 2 as seen from the voltage amplifying stage 1, which is the input impedance of the FET buffer circuit, is extremely high, the buffer 2 is not affected by variations of the load $R_L$ as was the circuit of FIG. 1. Moreover, the presence of the buffer circuit 2 does not adversely affect the operation of the voltage amplifying stage 1, so that stable operation thereof as a negative feedback circuit is assured.

Furthermore, since the FET buffer circuit 2 has a cascade construction, it retains the merits of the earlier cascode amplifier, thus providing very desirable characteristics for the amplifier circuit. Particularly, the voltages $V_{DS}$ between the drains and sources of the FETs $Q_6$ and $Q_7$ are maintained at values equal to the voltage drops across the resistors $R_4$ and $R_5$ due to the constant current sources $I_1$ and $I_2$, respectively (neglecting the $V_{BE}$ drops of the transistors $Q_8$ and $Q_9$), and hence the operation of the FETs $Q_6$ and $Q_7$ is made extremely stable.

In the circuit of this embodiment, however, constant current sources $I_1$ and $I_2$ must be provided for supplying current through the resistors $R_4$ and $R_5$. Therefore, a diode ($D_1$) must be connected between the resistors $R_4$ and $R_5$. This inevitably increases the number of the elements (PN junctions) of the diodes $D_1$ and $D_2$, which are multiple junction devices. In addition, such a construction entails a drawback in it being difficult to maintain the currents flowing through the FETs $Q_8$ and $Q_9$ at constant values.

Figure 3:
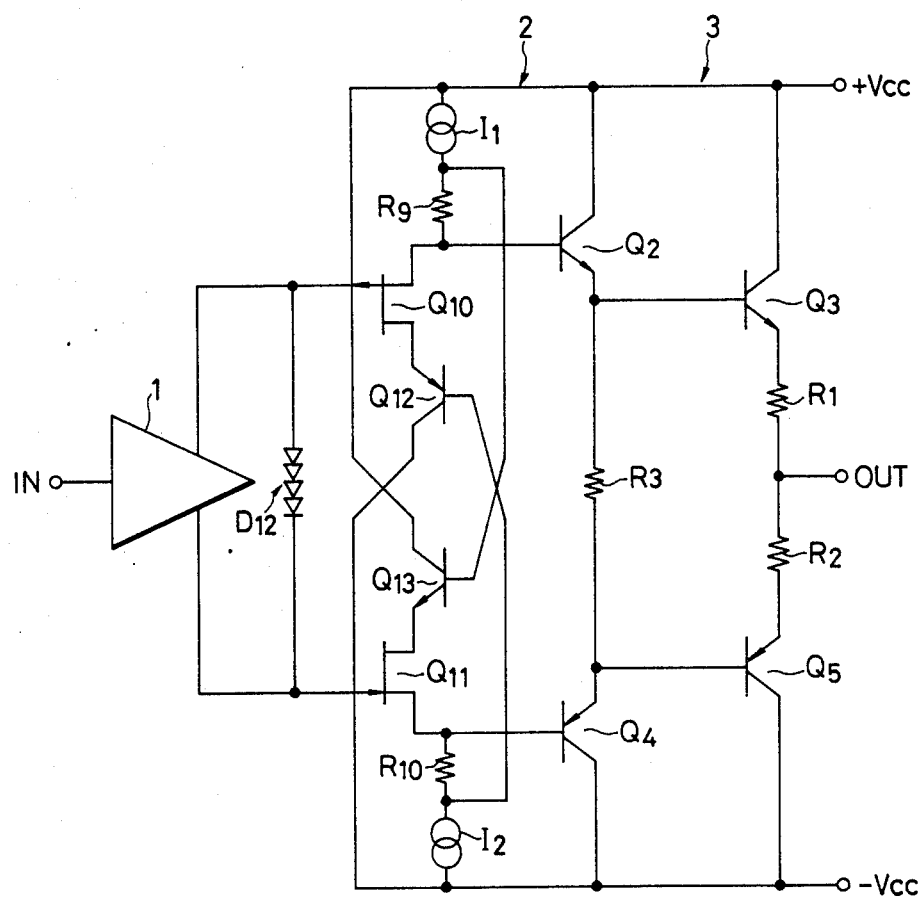

The circuit shown in FIG. 3 eliminates such difficulties. In FIG. 3, components similar to those seen in FIG. 2 are designated by like reference numerals.

In FIG. 3 a FET buffer circuit 2 is composed of a P-channel FET $Q_{10}$, the source of which is connected to the base of a transistor $Q_2$, and an N channel FET $Q_{11}$, the source of which is connected to the base of a transistor $Q_4$. As cascade transistors for the two FETs $Q_{10}$ and $Q_{11}$, a PNP transistor $Q_{12}$ and an NPN transistor $Q_{13}$, respectively, are provided. The collector of the transistor $Q_{12}$ is connected to the negative terminal of the power supply, while the collector of the transistor $Q_{13}$ is connected to the positive terminal. Constant current sources $I_1$ and $I_2$ are also provided for supplying current to the sources of the FETs $Q_{10}$ and $Q_{11}$ through source resistors $R_9$ and $R_{10}$, respectively. Portions of the currents supplied from the constant current sources $I_2$ and $I_1$ are applied to the bases of the cascode transistors $Q_{12}$ and $Q_{13}$, respectively. The output signal of the voltage amplifying stage 1 is directly applied across the gates of the two FETs $Q_{10}$ and $Q_{11}$. The construction of the remainder of the circuitry shown in FIG. 3 is similar to that of FIG. 2.

The circuit of FIG. 3 has the same advantageous characteristics as the circuit shown in FIG. 2. In addition, the circuit of FIG. 3 exhibits further advantageous features such as the operation thereof being stable because the source currents of the FETs $Q_{10}$ and $Q_{11}$ are determined by the currents from the constant current sources $I_1$ and $I_2$ and the circuit having a current limiting characteristic because an output current of no more than $h_{fe}$ (of the output transistor) multiplied by the current output $I_o$ of the constant current sources $I_1$ and $I_2$ flows through the output transistors when the output terminals of the circuit are short-circuited. Furthermore, there is another advantage of not requiring the multiple junction diode $D_1$ which is essential to the circuit of FIG. 2.

As described above, according to the present invention, output distortion of the SEPP circuit is minimized, and adverse effects of a load to the preceding stage are eliminated regardless of the amount of the load. As a consequence, a negative feedback amplifier circuit having very little distortion, a stable operation, and good transient characteristics is obtained. Furthermore, since the circuit has a current limiting characteristic, no additional overcurrent protecting circuit is required, and the construction of the circuit is much simplified.

I claim:

1. A low noise power amplifier circuit comprising: an NPN first transistor having a collector connected to a positive terminal of a power supply; a first resistor coupled between an emitter of said first transistor and an output terminal; a PNP second transistor having a collector connected to a negative terminal of said power supply; a second resistor connected between an emitter of said second transistor and said output terminal; an NPN third transistor having a collector connected to said positive terminal and an emitter connected to a base of said first transistor; a PNP fourth transistor having a collector connected to said negative terminal and an emitter connected to a base of said second transistor; a third resistor connected between said bases of said first and second transistors; an NPN fifth transistor having a collector connected to said positive terminal; a first constant current source connected between said positive terminal and a base of said fifth transistor; a fourth resistor connected between said base of said fifth transistor and a base of said third transistor; a PNP sixth transistor having a collector connected to said negative terminal; a second constant current source connected between said negative terminal and a base of said sixth transistor; a fifth resistor connected between said base of said sixth transistor and said base of said fourth transistor; a first multi-junction diode connected between said bases of said third and fourth transistors; an N-channel FET seventh transistor having a drain connected to an emitter of said fifth transistor and a source connected to said base of said third transistor; a P-channel FET eighth transistor having a drain connected to an emitter of said sixth transistor and a source connected to said base of said fourth transistor; a sixth resistor connected between gates of said seventh and eighth transistors; a voltage amplifier having positive and negative outputs; a seventh resistor connected between said positive output of said voltage amplifier and said gate of said seventh transistor; an eighth resistor connected between said negative output of said voltage amplifier and said gate of said eighth transistor; and a second multi-junction diode connected between said positive and negative outputs of said voltage amplifier.

2. A low noise power amplifier circuit comprising: an NPN first transistor having a collector connected to a positive terminal of a power supply; a first resistor connected between an emitter of said first transistor and an output terminal; a PNP second transistor having a collector connected to a negative terminal of said power supply; a second resistor connected between an emitter of said second transistor and said output terminal; an NPN third transistor having an emitter connected to said positive terminal and a collector connected to a base of said first transistor; a PNP fourth transistor having a collector connected to said negative terminal and an emitter connected to a base of second transistor; a third resistor connected between said bases of said first and second transistors; a PNP fifth transistor having a collector connected to said negative terminal; an NPN sixth transistor having a collector connected to said positive terminal; a first constant current source connected between said positive terminal and a base of said sixth transistor; a second constant current source connected between said negative terminal and a base of said fifth transistor; a P-channel FET seventh transistor having a drain connected to an emitter of said fifth transistor and a source connected to a base of said third transistor; a fourth resistor connected between said base of said sixth transistor and said base of said third transistor; an N-channel FET eighth transistor having a drain connected to an emitter of said sixth transistor and a source connected to the base of said fourth transistor; a fifth resistor connected between said base of said fifth transistor and said base of said fourth transistor; a voltage amplifier having positive and negative outputs, said positive output being connected to a gate of said seventh transistor and said negative output being connected to a gate of said eighth transistor; and a multi-junction diode connected between said positive and negative outputs of said voltage amplifier.

3. A low noise power amplifier circuit comprising: a voltage amplifying stage; a power amplifying stage of a single-ended push-pull type having driver output transistor pairs connected in an emitter follower configuration; a field effect transistor coupled in a source follower configuration for coupling an output of said voltage amplifying stage to an input of said power amplifying state;

a cascade transistor cascade connected with said field effect transistor; and a constant current source for supplying a constant current to a source of said field effect transistor;

wherein one said field effect transistor, cascade transistor and constant current source is provided for each of positive and negative polarity portions of said power amplifying stage.

* * * * *